(12) United States Patent
Wang et al.

(10) Patent No.: US 9,219,599 B2
(45) Date of Patent: Dec. 22, 2015

(54) CLOCK AND DATA RECOVERY CIRCUIT

(71) Applicant: FUDAN UNIVERSITY, Shanghai (CN)

(72) Inventors: Zhongkai Wang, Shanghai (CN); Rui Bai, Shanghai (CN); Patrick Yin Chiang, Shanghai (CN)

(73) Assignee: FUDAN UNIVERSITY (CN)

( * ) Notice: Subject to any disclaimer, the term of this patent is extended or adjusted under 35 U.S.C. 154(b) by 0 days.

(21) Appl. No.: 14/560,820

(22) Filed: Dec. 4, 2014

(65) Prior Publication Data

US 2015/0180644 A1  Jun. 25, 2015

(30) Foreign Application Priority Data

Dec. 19, 2013 (CN) .......................... 2013 1 0701151
Nov. 24, 2014 (CN) .......................... 2014 1 0678217

(51) Int. Cl.
*H04L 7/033* (2006.01)
*H03L 7/00* (2006.01)

(52) U.S. Cl.
CPC . *H04L 7/033* (2013.01); *H03L 7/00* (2013.01)

(58) Field of Classification Search
USPC .................................................. 375/374, 375
See application file for complete search history.

(56) References Cited

U.S. PATENT DOCUMENTS

| | | | |
|---|---|---|---|
| 2006/0208805 A1* | 9/2006 | Galloway et al. ............... | 331/16 |
| 2007/0002993 A1* | 1/2007 | Wang et al. .................... | 375/374 |
| 2009/0074125 A1* | 3/2009 | Lin ................................ | 375/375 |
| 2010/0091927 A1* | 4/2010 | Walker et al. ................. | 375/374 |
| 2013/0108001 A1* | 5/2013 | Chang et al. .................. | 375/374 |

* cited by examiner

*Primary Examiner* — Eva Puente
(74) *Attorney, Agent, or Firm* — Ostrolenk Faber LLP

(57) ABSTRACT

A clock and data recovery (CDR) circuit employing zero-crossing linearizing (ZCL) technique. The circuit including a voltage controlled oscillator (VCO), an inject-locked divider (ILD), a variable delay unit, a linearized loop, a bang-bang loop, and a loop filter (LP). The differential clock generated by VCO passes through ILD for frequency dividing and variable delay unit to generate 8-phase clocks. Then using these clocks, the PDs over-sample the input data, followed by synchronization and logic operation to control the CPs output current pulses. These currents filtered by LP control the VCO to finish the loop. The circuit recovers 4 channel data and corresponding clocks of the input with low power broken-down and preferable jitter performance and locking property.

9 Claims, 5 Drawing Sheets

CLOCK AND DATA RECOVERY CIRCUIT

FIELD OF INVENTION

This patent is concerned with communication science and technology, and, particularly to a clock and data recovery circuit (CDR).

BACKGROUND OF INVENTION

Since the demand and the increasing of various portable devices, the data volume on the communication links is rising exponentially, requiring the wireline communication systems, especially the data center providing high-speed, accurate and stable data transmission solutions. Considering as the core of data center equipment and facilities, optical communication and high-speed wireline communication systems request drastic improvement in speed, power and stability, while in all its blocks, the clock and data recovery circuit determines the clock quality of the total receiver end and the jitter and bit error rate (BER) of the received data.

Traditional CDRs usually adopt III-V processes likes GaAs, which is deemed as high-speed and low-noise material and perfect for radio frequency circuit. However, its high supple voltage decides its low-grade performance in power consumption. Meanwhile, the improvement in CMOS process and the increasing in its characteristic frequency, derived from the reduction in character size, makes it possible to implement low-power, high-performance, high-speed circuit by CMOS process.

There are two main categories for conventional CDRs: linear and bang-bang (BB). While linear CDRs exhibit excellent recovered clock jitter due to the lower quantization jitter, the input data is supposed to drive the logic circuits directly, which demands high input swing. Besides, the locking time and jitter tolerance of linear CDRs are typically inferior due to the smaller loop bandwidth. Alternatively, bang-bang CDRs utilize oversampling to determine the edge transition location with slicer, reducing the input data swing to about 50 mV. This binary judgment results in a faster locking process and larger jitter tolerance, but unfortunately degrades quantization jitter and bit-error rate (BER). It is challenging to adopt the advantages of both architectures and eliminate their weaknesses.

SUMMARY OF THE INVENTION

This invention proposes a novel CDR circuit with improved input sensitivity, jitter performance and locking characteristics.

These improvements are achieved with the CDR that contains the following circuits:
a VCO;
a ILD, connected to the output of the said VCO;
a variable delay unit, connected to the output of the said ILD;
a linearized loop, including linearized PDs, employing ZCL technique, connected to the output of said variable delay unit, and linearized CPs, connected to the output of linearized PDs;
a bang-bang loop, including bang-bang PDs, also connected to the output of said variable delay, and bang-bang CPs, connected to the output of bang-bang PDs; each PD contains a slicer;
a LP, connected to the output of above CPs;

The differential sine clock generated by above VCO injects into ILD for frequency dividing and generates 4-phase quadrature clocks, which pass through variable delay unit to generate other 4-phase clocks making up 8-phase quadrature clocks. Using these clocks, the PD over-samples the input data by two.

The PD above receive input data, oversample them with 8 slicers employing 8 quadrature clocks, to attain its data and edge information and drive the CP following it. The current of the CP is summarized and filtered by the LF to control the output frequency of the VCO.

The comparator used in the PD has two stages, the first of which is an integrating amplification stage and the second is a positive-feedback stage for regeneration.

In the bang-bang loop, input signal is sampled by bang-bang dynamic comparator before it gets synchronized and enters the phase detection logic, which drives a bang-bang CP.

In the linearized loop, the integrate-and-amplify stage of the dynamic comparator has a linear output. It is followed by a variable-gain buffer and several stages of linear dynamic latch for adding delay and amplification.

Linearized CP merges the slicers' digital output of the massage presenting the early/late of input data and the amplified analog output of the information presenting the amplitude of the sampling time, generating current with variable amplitude and hence, reduces ripple on the voltage control line of VCO.

The time that the linear analog output of the slicers' integral stage passing through delay and amplifier unit reaches the linearized CP, is the same as the time that the sampling signal of bang-bang slicers passing through synchronization and logic calculation reaches the linearized CP.

The ratio of linearized loop and bang-bang loop could be adjusted by the current amplitude of the linearized CP and bang-bang CP, to realize different loop property.

The linearized CP described above is comprised of NMOS M1-M6, PMOS M7-M10.

NMOS M1 and M2 make up a pair of differential input resistor, while the sources of M3 and M4 are linked to the drain of M1 and the sources of M5 and M6 are linked to drain of M2.

The drains of PMOS M7-M10 are connected to the drains of M3-M6 separately.

NMOS M1 to M6 comprise of the input transistor of the linearized CP, while the PMOS M7 to M10 mirror and summarize the currents coming from NMOS M3 to M6 controlled by the CP controlling signal UPx and DNx (x is from 0 to 3) at their gates. The magnitude of these currents is regulated by NMOS M1 and M2, which is controlled by the delay and amplifying analog signal Inx (x is from 0 to 3), presenting the multiplying result between the CP controlling signal and delay and amplifying signal.

The data and edge information of the input data is also synchronized by the PD and the synchronized data is exported outside the chip by current mode buffers.

Compared to current techniques, one advantage of the clock and data recovery circuit in this invention is the adoption of a ring-based injection-locked frequency divider, which has lower power consumption compared to traditional current-mode frequency divider, while meeting the locking-range requirement.

In this invention, the dynamic comparator at the data input greatly improves the input sensitivity. This lowers the gain requirement of the preceding trans-impedance amplifier, thus reduces power consumption of the whole system.

By operating 4 PDs in parallel, this invention reduces the speed requirement of the dynamic comparator and charge pump in each PD, which eases the design process and further reduces total power consumption.

By adopting linearized PD and CP, this invention reduces the control voltage ripple of the VCO, decreasing the jitter of output clock and data. This improves the performance of the whole receiver.

This invention adjusts the strength of the linearized loop and bang-bang loop by adjusting CP output current, to further control loop characteristics of the system for various operating conditions.

DETAILED DESCRIPTION OF THE INVENTION

The following contents further illustrate the detailed implementation of present invention in combination with attached drawings and detailed description of the embodiments.

Figure 1:
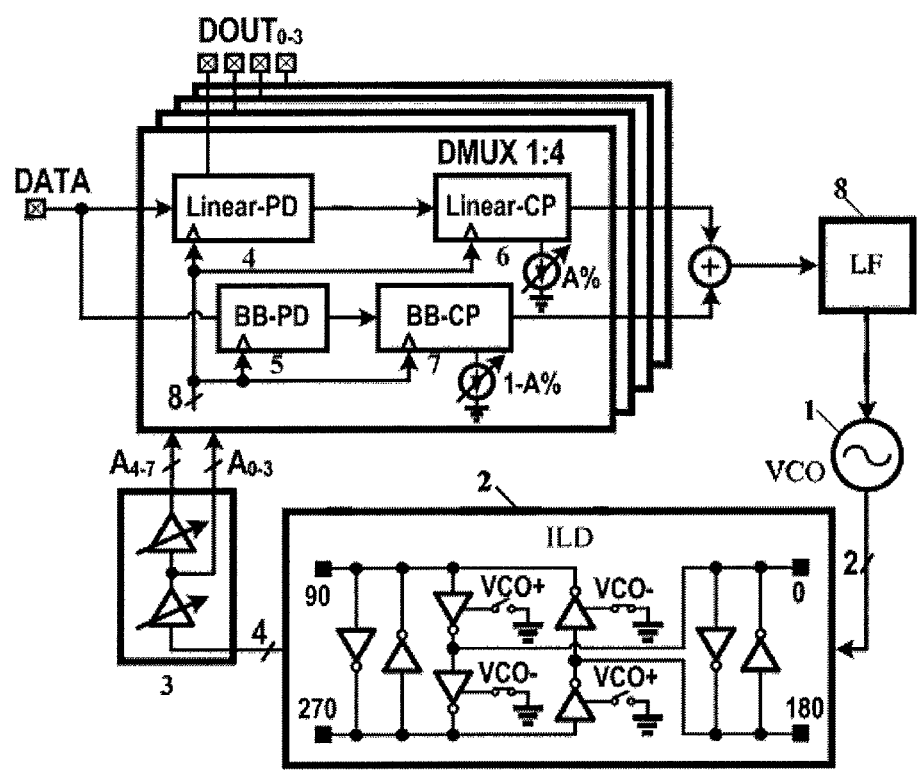
FIG. 1 is a system-level architecture of this invention.

As shown in FIG. 1, the 25 Gbps clock and data recovery circuit (CDR) using ZCL (zero-crossing linearizing) is disclosed in this invention contains: Voltage-Controlled Oscillator 1 (VCO); Injection-Locked Divider 2 (ILD), which is connected to the output of VCO 1; variable delay unit 3, connected to the output of ILD 2; linearized phase detector (PD) 4 using ZCL technique, and bang-bang PD 5, connected the output of variable delay unit 3; linearized Charge Pump (CP) 6 and bang-bang CP 7, which connects to the output of linearized PD 4 and bang-bang PD 5 respectively; Loop Filter (LF) 8, which connects to the output of linearized CP 6 and bang-bang CP 7.

Wherein, linearized phase detector (PD) 4 and linearized Charge Pump (CP) 6, which connected to the output of linearized PD constituted linearized loop.

Bang-bang PD 5 and bang-bang CP 7, which connected to output of bang-bang PD constituted bang-bang loop.

The VCO 1 working at 12.5 GHz generates differential sinusoidal clocks (CK), which are injected into the ring-based ILD 2 for frequency division after which 4 quadrature phases of 6.25 GHz clock are generated (A0-A3). The differential orthogonal clocks (A0-A3) are passed through variable-delay unit 3 to generate another 4 quadrature clocks (A4-A7), forming a total of 8 quadrate phases of 6.25 GHz clock. All 8 phases of clock are buffered before driving 2X-oversampling of 25 Gbps input clock.

To relax the speed requirement of dynamic comparator, D Flip-Flop and other logic circuits, the linearized PD 4 and bang-bang PD 5 adopt a 1:4 demultiplexing ratio.

Figure 2:
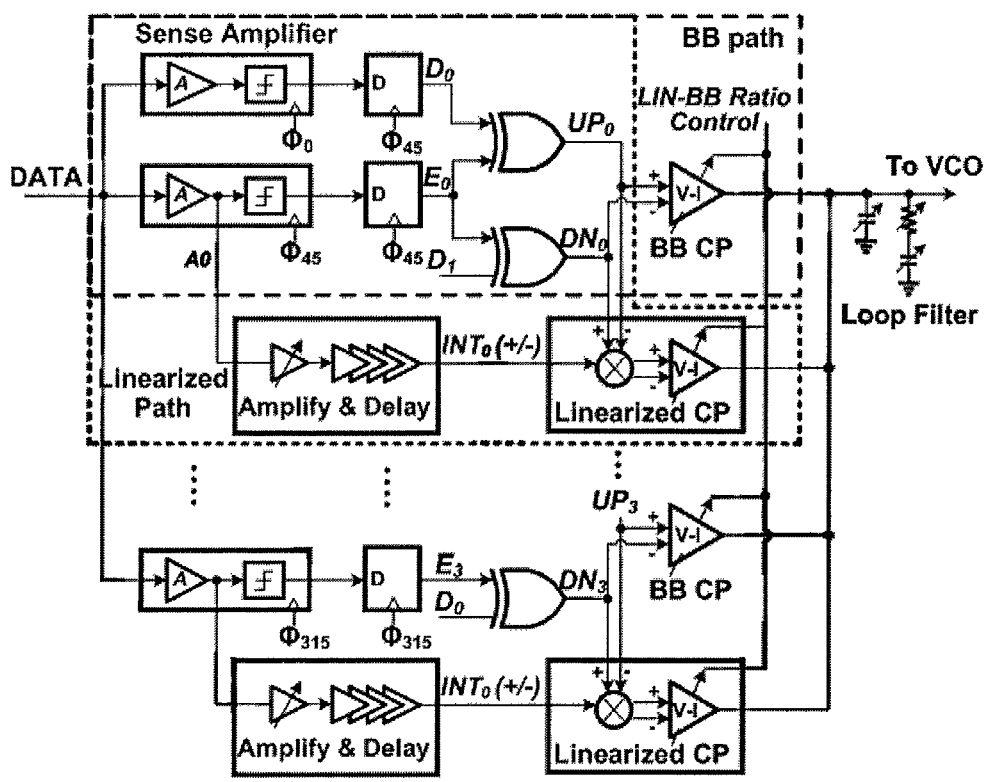
FIG. 2 is a schematic of the phase detector and charge pump of this invention.

As shown in FIG. 2, each of the 4 parallel path samples the 25 Gbps input data with high-speed dynamic comparators to obtain the information of relative position of input data and edge. The data and edge information are then synchronized by D Flip-Flops to generate signal (D0, E0). D0 and E0 are XORed to generate bang-bang charge pump (CP) control signal UP0, E0 and the next data D1 are XORed to generate control signal DN0.

The synchronized data signals D0, D1, D2 and D3 are buffered by CML (current mode logic) drivers before sent off-chip (DOUT0, DOUT1, DOUT2 and DOUT3) to drive 50Ω load outside the chip.

As shown in FIG. 2, in this implementation, the CDR contains both a linearized loop and a bang-bang loop. The linearized loop contains linearized PDs and associated linearized CPs, while the bang-bang loop contains bang-bang PDs and associated bang-bang CPs.

For the bang-bang loop, the bang-bang CP is directly driven by control signals UP0 and DN0 to generate positive or negative current pulses into the loop filter.

The linearized loop is described here using one of the demultiplexed phases. The linear analog output of the integrate-and-amplify stage of the high-speed dynamic comparator, A0, passes through several delay cell stages and variable-gain charge-based amplifiers for further delay and amplification. By design, the CP control signal (UP0 and DN0) from XOR logic and the delayed and amplified signal (INT0) arrive at the linearized CP at the same time. The linearized CP functions as both a multiplier and pulse current generator. The multiplication of CP control signal UP0/DN0 and differential signal INT0 generates a variable-amplitude current pulse, which reduces the VCO control voltage ripple.

The current outputs of four-way linearized and bang-bang CPs are summarized and fed into a loop filter to control the output frequency of the VCO. The ratio of linearize loop and bang-bang loop could be adjusted by the current amplitude of the bang-bang CP and linearized CP, to realize different loop property.

Figure 3:
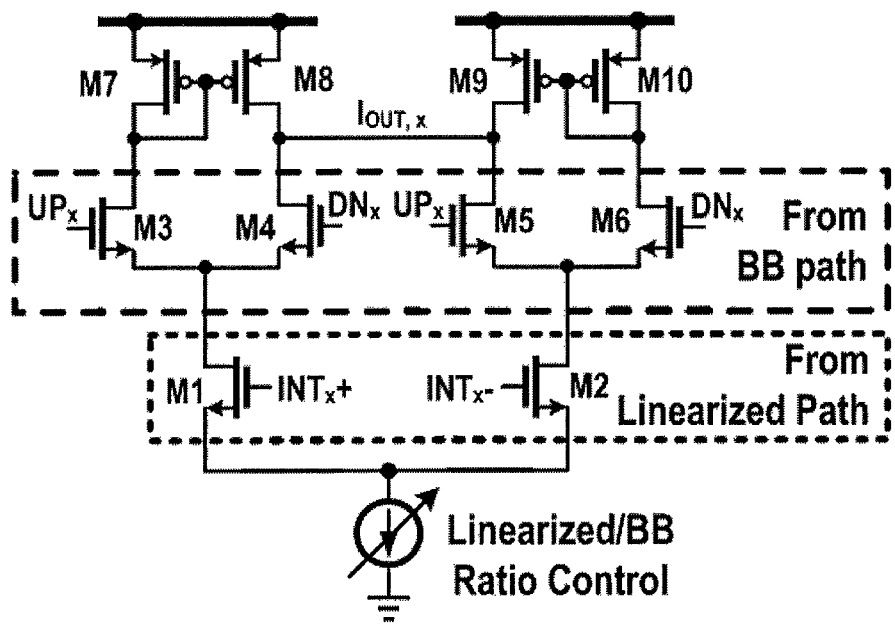
FIG. 3 is a schematic of the linearized charge pump of this invention.

FIG. 3 illustrates detailed implementation of the linearized CP. It contains NMOS transistors M1, M2, M3, M4, M5, M6 and PMOS transistors M7, M8, M9, M10.

While NMOS M3, M4, M5 and M6 constitute the input transistors of the linearized charge pump, NMOS M1 and M2 make up the differential transistor, controlling the generated currents of the whole linearized charge pump via the delay and amplifying analog signal INTx (x is from 0 to 3, that is INT0-INT3).

The sources of NMOS M3 and M4 are linked to the drain of NMOS M1 and the sources of NMOS M5 and M6 are linked to drain of NMOS M2. NMOS transistors M1, M2 control the orientation of the charge pump current through signals UPx (x is from 0 to 3, that is UP0-UP3) and DNx (x is from 0 to 3, DN0-DN3)

The drains of PMOS M7, M8, M9 and M10 are connected to the drains of M3, M4, M5 and M6 separately, mirroring the currents coming from NMOS M3 and M6 and summarizing it with the currents from NMOS M4 and M5, to finally fulfill the multiplication between the CP controlling signal and delay and amplifying signal.

Figure 4:
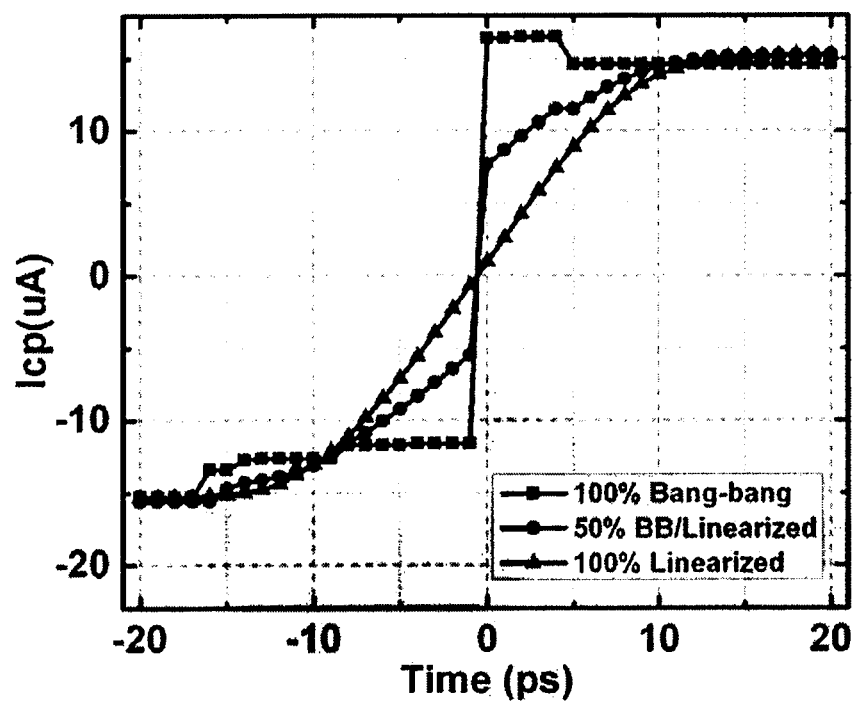
FIG. 4 indicates phase-current transfer characteristics of the phase detector and charge pump under different operating modes.

The phase transfer function of PD and CP in the circuit is shown in FIG. 4. While 100% linearized mode exhibits enough linearity and 100% bang-bang mode displays apparent bang-bang characteristics, 50% BB-linearized mode makes a compromise between them.

Figure 5:
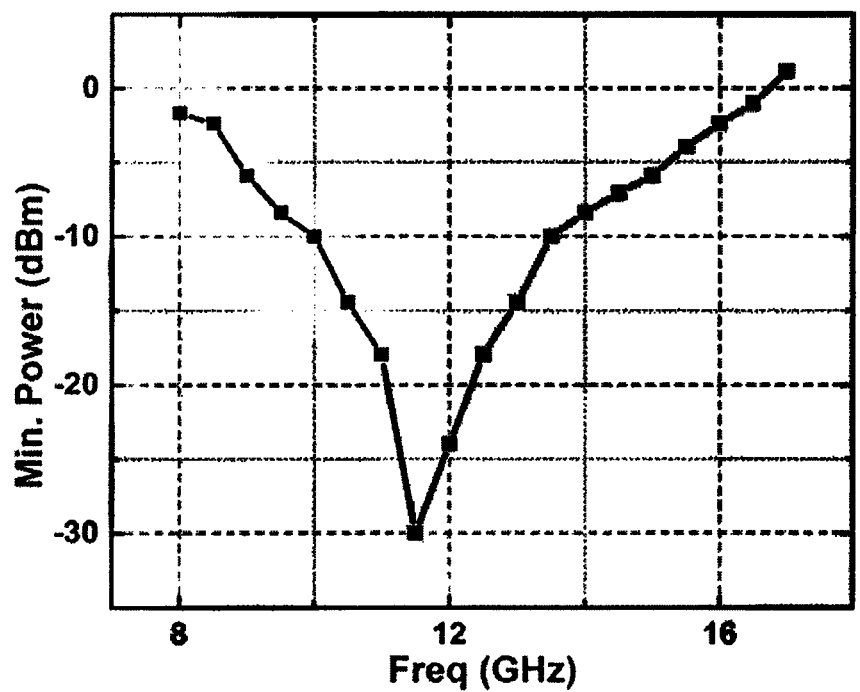
FIG. 5 indicates characteristics of the injection-locked frequency divider proposed in this invention.

FIG. 5 shows the frequency dividing characteristics of ring-oscillator based inject-locked divider. When the input power bellows 0 dBm, the divider can work with input clock signal from 8-16 GHz.

Though this invention has introduced the optimal instance above in details, we need to notice that the description should not be limited in this design. As the technicians read the former content, a variety of modifications and replacements to this invention is noticeable. Therefore, the protection region of this invention should be restricted by the privilege attached.

The invention claimed is:

1. A clock and data recovery (CDR) circuit, comprising:
   a voltage controlled oscillator (VCO);
   an inject-locked divider (ILD), connected to an output of the said VCO;
   a variable delay unit, connected to an output of the said ILD;
   a linearized loop, including linearized phase detectors (PDs), employing zero-crossing linearizing (ZCL) technique, connected to an output of said variable delay unit, and linearized charge pumps (CPs), connected to an output of said linearized PDs;
   a bang-bang loop, including bang-bang PDs, also connected to the output of said variable delay unit, and bang-bang CPs, connected to an output of said bang-bang PDs, each of linearized PDs and bang-bang PDs contains a slicer,
   a loop filter (LP), connected to an output of the linearized CPs and bang-bang CPs;
   differential sine clock, generated by said VCO injects into ILD for frequency dividing and generates 4-phase differential quadrature clocks, which pass through said variable delay unit to generate another 4-phase clocks making up 8-phase quadrature clocks, using the 8-phase quadrature clocks, the linearized PDs and the bang-bang PDs over-sample an input data by two times of a data rate;
   said linearized PDs and bang-bang PDs receive the input data, oversample the input data with 8 slicers employing 8 differential quadrature clocks, to attain data and edge information thereof and drive the CP following the linearized CPs and bang-bang CPs, a current outputs of a four-way linearized CPs and bang-bang CPs are summarized and fed into a loop filter to control an output frequency of the VCO.

2. The CDR circuit of claim 1, wherein said slicers of said linearized PDs and bang-bang PDs employ a two-stage structure to accomplish integrating amplifying and regenerative amplifying separately.

3. The CDR circuit of claim 2, wherein, in said bang-bang loop, a sampling output signal of slicers is synchronized, and sent to enter a phase detection logic to drive following bang-bang CPs.

4. The CDR circuit of claim 2, wherein,
   in said linearized loop, an output of the slicer linear stage passes through a buffer with variable gain and several dynamic latches to fulfill delaying and amplifying;
   every linearized CP in the linearized loop merges the slicers' digital output of the message presenting an early/late of input data and an amplified analog output of an information presenting an amplitude of a sampling time, generating current with variable amplitude to reduce ripple on the voltage control line of VCO.

5. The CDR circuit of claim 4, wherein, a linear analog output of the slicers' integral stage delayed and amplified reaches the linearized CP at a same time as the time that the sampling signal of bang-bang slicers synchronized and logic calculated reaches the linearized CP.

6. The CDR circuit of claim 5, wherein a ratio between linearized loop and bang-bang loop is adjusted by a current amplitude of the linearized CP and bang-bang CP separately to realize different loop property.

7. The CDR circuit of claim 1, wherein the linearized CP comprises:
   a plurality of negative channel metal oxide semiconductor transistors (M1, M2, M3, M4, M5, M6);
   a plurality of positive channel metal oxide semiconductor transistors (M7, M8, M9, M10);
   M1 and M2 make up a pair of differential input resistor, while sources of M3 and M4 are linked to drain of M1 and sources of M5 and M6 are linked to drain of M2; and drains of M7, M8, M9, M10 are connected to drains of M3, M4, M5, M6 separately.

8. The CDR circuit of claim 7, wherein, the M1 to M6 are input transistors of the linearized CP, and M7 to M10 mirror and summarize the currents coming from M3 to M6, which are controlled by the CP controlling signal UPx and DNx being at gates of M3 to M6; the magnitude of currents coming from M3 to M6 being regulated by Ml and M2, which are controlled by the delay and amplifying analog signal Inx, presenting the multiplying result between the CP controlling signal and delay and amplifying signal, x being in the range 0 to 3.

9. The CDR circuit of claim 1, wherein, the input data and edge information of the input data is also synchronized by the linearized PDs and bang-bang PDs and the data synchronized is exported outside the CDR by current mode buffers.

* * * * *